US006820240B2

(12) United States Patent
Bednar et al.

(10) Patent No.: US 6,820,240 B2
(45) Date of Patent: Nov. 16, 2004

(54) VOLTAGE ISLAND CHIP IMPLEMENTATION

(75) Inventors: Thomas R. Bednar, Essex Junction, VT (US); Scott W. Gould, South Burlington, VT (US); David E. Lackey, Jericho, VT (US); Douglas W. Stout, Milton, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 10/065,201

(22) Filed: Sep. 25, 2002

(65) Prior Publication Data

US 2004/0060023 A1 Mar. 25, 2004

(51) Int. Cl.[7] .............................................. G06F 17/50
(52) U.S. Cl. ................... 716/1; 716/7; 716/18
(58) Field of Search ................ 716/1–2, 4–8, 716/11–14, 18

(56) References Cited

U.S. PATENT DOCUMENTS 6,099,580 A * 8/2000 Boyle et al. .................... 716/7
6,324,678 B1 * 11/2001 Dangelo et al. .............. 716/18
6,584,596 B2 * 6/2003 Buffet et al. ................... 716/1

* cited by examiner

Primary Examiner—Leigh M. Garbowski
Assistant Examiner—Paull Dinh
(74) Attorney, Agent, or Firm—McGinn & Gibb, PLLC; Richard M. Kotulak, Esq.

(57) ABSTRACT

A method and structure for designing an integrated circuit chip supplies a chip design and partitions elements of the chip design according to similarities in voltage requirements and timing of power states of the elements to create voltage islands. The invention outputs a voltage island specification list comprising power and timing information of each voltage island; and automatically, and without user intervention, synthesizes power supply networks for the voltage islands.

14 Claims, 15 Drawing Sheets

VOLTAGE ISLAND CHIP IMPLEMENTATION

BACKGROUND OF THE INVENTION

The present invention generally relates to integrated circuits and more particularly to an improved integrated circuit design and method which utilizes voltage islands that operate at independent voltages and can be selectively gated to reduce power consumption.

DESCRIPTION OF THE RELATED ART

As technology scales for increased circuit density and performance, the need to reduce power consumption increases in significance as designers strive to utilize the advancing silicon capabilities. The consumer product market further drives the need to minimize chip power consumption.

The total power consumed by conventional CMOS circuitry is composed of two primary sources. The first is active power consumed by circuits as they switch states and either charge or discharge the capacitance associated with the switching nodes. Active power represents the power consumed by the intended work of the circuit to switch signal states and thus execute logic functions. This power is not present if the circuit in question is not actively switching. Active power is proportional to the capacitance that is switched, the frequency of operation, and to the square of the power supply voltage. Due to technology scaling, the capacitance per unit area increases with each process generation. The power increase represented by this capacitance increase is offset by the scaling of the power supply voltage, Vdd.

The frequency of operation, however, increases with each generation, leading to an overall increase in active power density from technology generation to technology generation. This increasing power density in turn drives the need for more expensive packaging, complex cooling solutions and decreased reliability due to increased temperatures. In addition to active power, there are components of leakage power, the most dominant of which is the sub-threshold current of the transistors in the circuit. As silicon technologies advance, smaller geometries become possible, enabling improvements of device structures including lower transistor oxide thickness (Tox), which in turn increases transistor performance. To maintain circuit reliability, Vdd must be lowered as Tox is reduced. As Vdd is reduced, the transistor threshold voltage (Vt) must be reduced in order to maintain or improve circuit performance, despite the drop in Vdd. This decrease in Vt and Tox then drives significant increases in leakage power, which has previously been negligible. As silicon technologies move forward, leakage currents become as important as active power in many applications. Therefore, there is a need for a method and structure that increases performance, while at the same time decreases power consumption. The invention described below satisfies these needs.

BRIEF SUMMARY OF THE INVENTION

It is therefore an object of the present invention to provide a method of designing an integrated circuit chip that supplies a chip design and partitions elements of the chip design according to similarities in voltage requirements and timing of power states of the elements to create voltage islands. The invention outputs a voltage island specification list that can include power, simulation, reliability, floorplanning, and/or timing information of each voltage island. The invention simulates the chip design using an unknown voltage state propagation on voltage island cell outputs identified by a power-on/off control signal within the voltage island specification list.

The invention also provides a method of designing an integrated circuit chip that supplies a chip design and partitions elements of the chip design according to similarities in voltage requirements and timing of power states of the elements to create voltage islands. The invention outputs a voltage island specification list that has power and timing information of each voltage island and automatically, and without user intervention, synthesizes power supply networks for the voltage islands.

The invention performs physical placement of circuit elements on the integrated circuit chip according to a hierarchy established in the voltage island specification list. During the physical placement processing, limits are placed upon inserting logic elements within the voltage islands. The invention performs routing physical wiring within the integrated circuit chip according to a hierarchy established in the voltage island specification list. The invention constrains placement of physical pins to edges of the voltage islands adjacent power rings of a power supply within the integrated circuit chip. The specification list can include a power source name, a power source type, minimum voltage level, maximum voltage level, nominal voltage level, switching signal name, switching signal type, power on hours, and/or steady state on percentage.

BRIEF DESCRIPTION OF THE SEVERAL VIEWS OF THE DRAWINGS

The foregoing and other objects, aspects and advantages will be better understood from the following detailed description of a preferred embodiment(s) of the invention with reference to the drawings, in which.

DETAILED DESCRIPTION OF THE INVENTION

The power challenges posed by advanced technologies force system designers to make choices concerning device structures and voltage levels for the functions they are designing. In previous generations, large functional blocks were not integrated on the same chip, so these choices could be made independently for each block. High levels of integration supported by system-on-a-chip (SoC) enabling technology drive single chip implementations, where traditional approaches to power distribution and performance optimization fail to provide the flexibility of voltage and technology optimization of the previously disintegrated solution.

The invention divides each semiconductor chip into individual functional blocks (voltage islands). These voltage islands of the SoC design can have power characteristics unique from the rest of the design and, with the invention, can be optimized accordingly.

Figure 1:
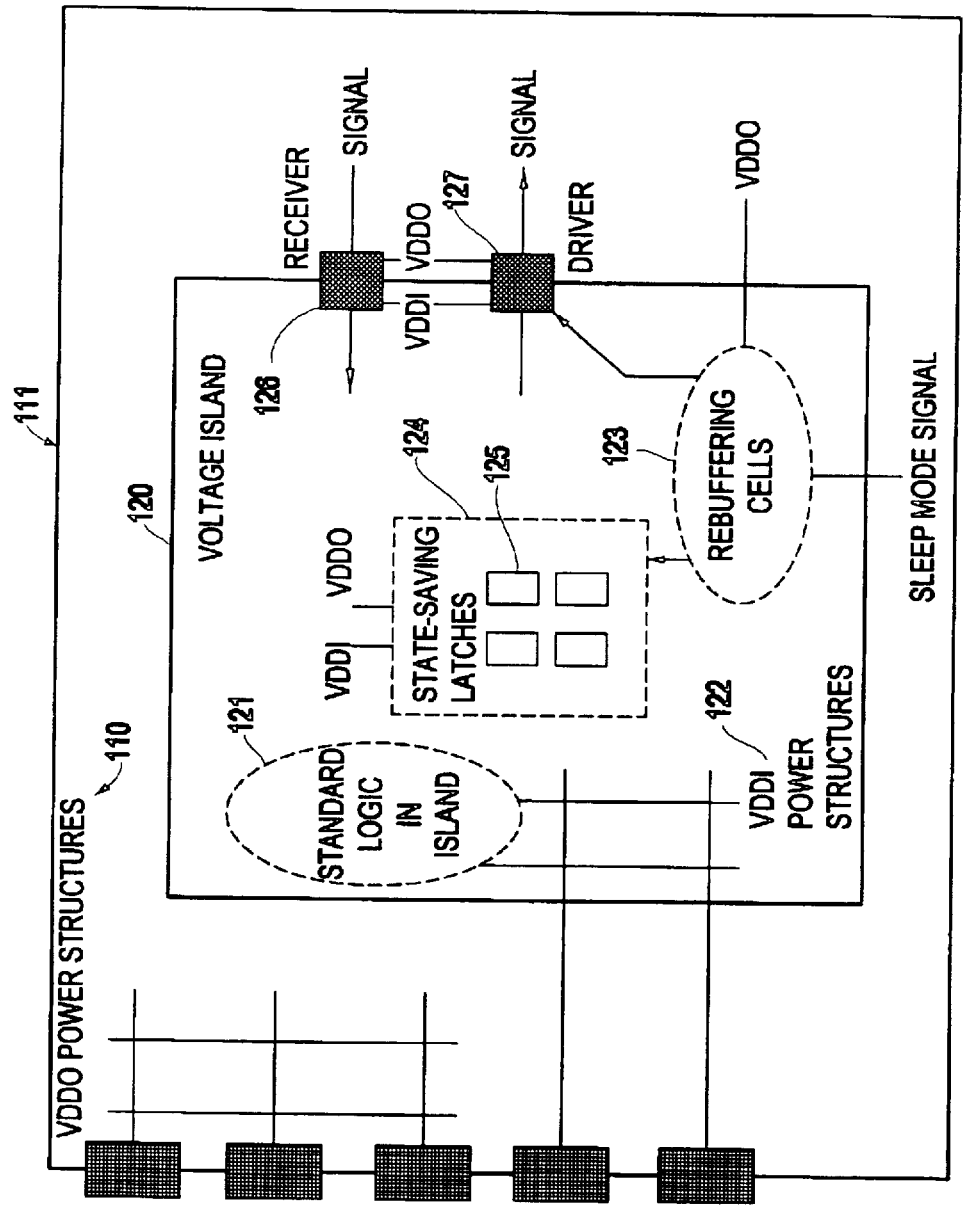
FIG. 1 is a schematic diagram of a chip containing a voltage island, according to the invention.

An SoC architecture based on Voltage Islands uses additional design components to ensure reliable communications across island boundaries, distribute and manage power, and save and restore logic states during power-off and on. FIG. 1 illustrates the multiple power sources used with the inventive voltage islands. More specifically, FIG. 1 illustrates power structures 110 (VDDO) external to the voltage island 120 as well as power structures 122 (VDDI) internal to the voltage island 120. Item 121 represents standard logic within the island 120. Item 123 represents rebuffering cells. Item 124 illustrates a region of state-saving latches 125 used to store logic states during power-off periods. In addition, a receiver 126 and driver 127 are also illustrated in FIG. 1. The Voltage Island 120 represents a level of hierarchy with unique powering that exists within a parent block 111 which constitutes a physical region in which the island 120 is placed. An island' parent block may be the top level of a chip design or even another island at the next highest level of chip hierarchy.

As shown in FIG. 1, the circuits within a Voltage Island are primarily powered from the island voltage, called VDDI (VDD-island or VDD-inside), while the circuits in the parent terrain are powered from a supply voltage called VDDO (VDD-outside). deeper hierarchy, the VDDO of one island may be equivalent to the VDDI of a parent island in which it is contained.

The relationship between the voltages (VDDI and VDDO) of an island 120 and its parent block 111 may vary considerably depending on how Voltage Islands are employed. For example, a dynamically powered island might have VDDI greater than VDDO when operating at maximum performance, VDDI less than VDDO when operating at reduced performance or to preserve states, and VDDI=0 V when fully powered down for standby current control.

Voltage variation present a problem for traditional, static complementary metal oxide semiconductor (CMOS) logic gates. When such a gate operates at a voltage sufficiently lower than the gate it drives, signal margins and performance will degrade, and the driven circuit will consume significantly higher power. Further increases in the voltage difference will eventually result in unreliable signal switching. Additional circuitry 123 is used to handle the differences in both magnitude and timing that can occur between VDDI and VDDO at island boundaries. Receivers 126 perform this function for signals going from the parent block into the island, while driver cells 127 perform the equivalent for signals from island to the parent block. These drivers and receivers provide reliable voltage level shifting from VDDI and VDDO for a wide range of operating voltages, and do so with minimal impact to signal delay or duty cycle.

In applications where VDDI or VDDO are allowed to assume voltage values below those necessary to support reliable signal switching, the Voltage Island boundary also includes functions to disable communications across island boundaries and provide reliably controlled states (eg. logic 0, logic 1, or hold last active state) to downstream logic. Such an operation, known as fencing, prevents the undesired propagation of unknown (X) states by powered-off logic.

Many possibilities exist for powering Voltage Islands. VDDI or VDDO may be supplied directly from a unique, non-switched power distribution. One or both may be the output of an on-chip voltage regulator, whose voltage value may be fixed or programmable. Finally, VDDI or VDDO may be a switched version of some other voltage supply, controlled by one or more PFET or NFET switches. A given SoC design may use one or more of these approaches depending upon the product design objectives.

Leakage or standby power can be reduced by lowering the voltage of functionally-inactive islands well below the level required for reliable operation. However, some subset of the logic state, prior to power-down, may need to be preserved to resume operation once the island is again powered up, at the end of the inactive period. Special state-saving latches 125 and rebuffering cells 123 provide a solution to this problem, eliminating the need to transfer logic states off-island and back in order to save and restore necessary logic states. Whereas a standard latch in a given island would operate from the island voltage (VDDI), a state-saving latch is a modification of the standard latch, adding both a VDDO connection and a state control input to select between normal and state-saving operation. In normal operation, the state-saving latch behaves identically to the standard latch. In state-saving operation, the latch data is preserved in a portion of the latch powered only by VDDO, and all other latch inputs (clocks, data, scan) are ignored. As long as VDDO remains active, VDDI may be powered down without concern that unreliable logic levels will effect the latch's logic state. State-saving latches are designed to consume minimal power from the VDDO. The Voltage Island can be quickly returned to normal operation once VDDI is restored via the latch state control input.

Figure 2:
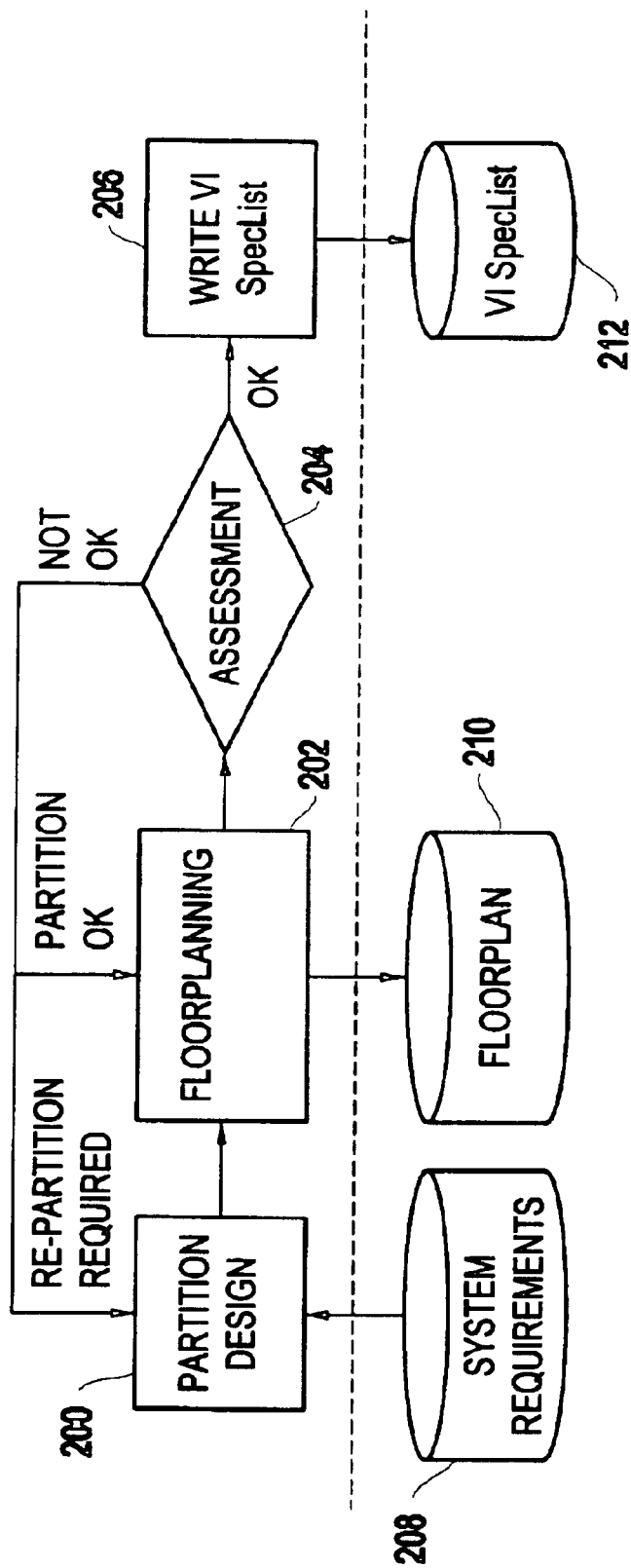
FIG. 2 is a schematic diagram illustrating one embodiment of the invention.

The invention designs chips with voltage islands using the general processing shown in FIG. 2. More specifically, the invention partitions the design into voltage islands 200. In other words, the invention analyzes and evaluates the possible operating voltages and the timings of power states of the different logical partitions to determine which of these logical partitions can be combined into voltage islands. Thus, with the invention, the logical partitions are grouped according to similarities in voltage requirements and similarities in the timing of power states, to reduce overall power consumption of the chip.

Figure 8:
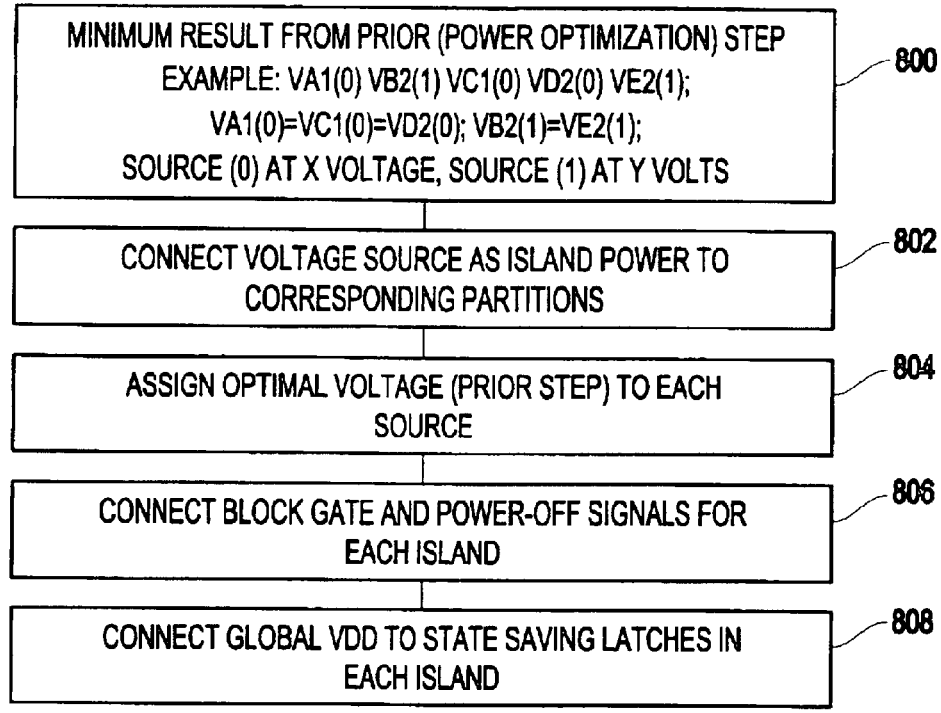
FIG. 8 is a flowchart illustrating the processing occurring in item 310 in FIG. 3.
Figure 9:
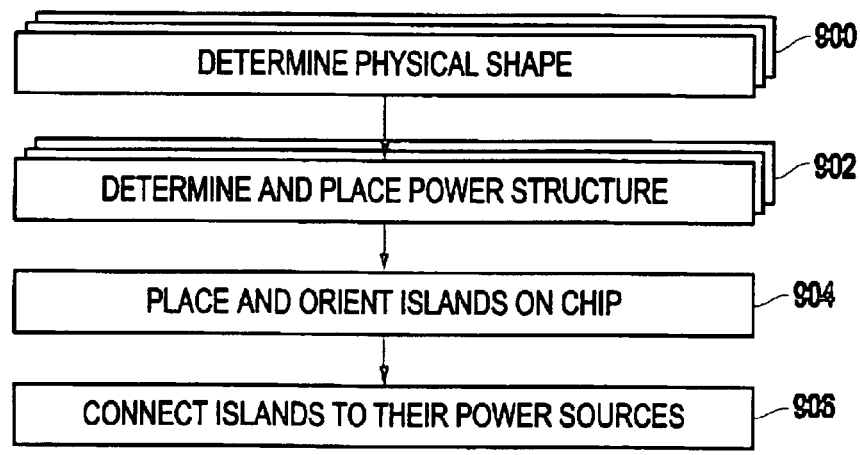
FIG. 9 is a flowchart illustrating the processing occurring in item 202 in FIG. 2.
Figure 10:
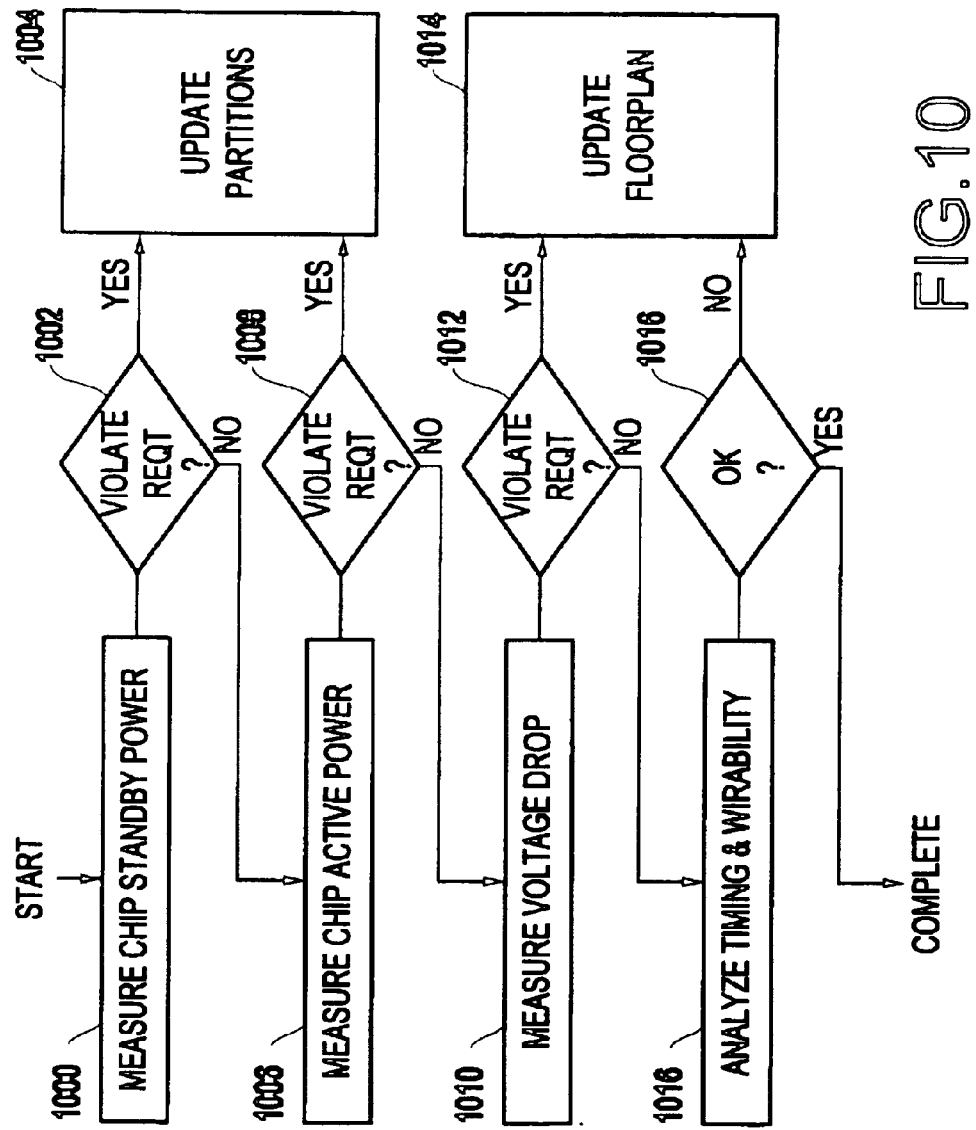
FIG. 10 is a flowchart illustrating the processing occurring in item 204 in FIG. 2.

The invention also performs floorplanning 202 and assessment 204 in order to enable the writing of a voltage island specification list (speclist) 206. System requirements 208 are input to aid in the partitioning 200. Similarly, the floorplan 210 is input into the floorplanning operation 202. The assessment 204 determines whether additional partitioning is required (in which case processing returns to the partitioning 200) or whether additional floorplanning is required (in which case processing returns to the floorplanning 202). The speclist produced is shown as item 212. The detailed operations involved in partitioning 200 are further explained with respect to FIGS. 3–8. The details of the floorplanning 202 are shown in FIG. 9 and the details of the assessment 204 are shown in FIG. 10.

The traditional process for the partitioning of an SoC design involves division and subdivision into an n-level functional hierarchy. The resulting functional components are grouped based upon minimizing the number and timing-criticality of signal that connect different groups. The chip area of each group is maintained between minimum and maximum sizes (high performance requirements may reduce maximum size of a group, and the need to limit floorplanning complexity may in turn limit minimum group size). Recently, the EDA industry has created a new wave of tools intended to aid the designer in chip partitioning. The methods employed by these tools range from early SoC block-level planning, to physically-aware gate-abstraction techniques, to quick placement of the netlist for floorplanning insight.

Designing for Voltage Islands changes the traditional hierarchal logical functional partitioning process into a hierarchy of voltage islands. When designing voltage islands, an optimal voltage for each functional component that minimizes active power at the required performance and components whose voltage supply can be independently sequenced are identified. Designing for voltage islands achieves a partitioning solution that minimizes chip power within additional chip-level constraints including: maximum peak power, the available voltage range of each power source, and the maximum peak and average power for each power source.

The invention designs chips with voltage island using the general processing shown in FIG. 2. More specifically, the invention partitions the design into voltage islands 200 and performs floorplanning 202 and assessment 204 in order to enable the writing of the speclist 206. System requirements 208 are input to aid in the partitioning 200. Similarly, the floorplan 210 is input into the floorplanning operation 202. The assessment 204 determines whether additional partitioning is required (in which case processing returns to the partitioning 200) or whether additional floorplanning is required (in which case processing returns to the floorplanning 202). The produced speclist is shown as item 212. The detailed operations involved in partitioning 200 are further explained with respect to FIGS. 3–8. The details of the floorplanning 202 are shown in FIG. 9 and the details of the assessment 204 are shown in FIG. 10.

To begin, the system requirements 208 that are supplied include the chip's (or SoC's) active power requirements, standby requirements, and available voltage supplies and levels. These define the maximum chip peak power, the number of latches per unit area that can act as state saving latches (based upon average available wire tracks to be used for global voltage supplies), the minimum inactive time that a candidate circuit can be powered-off (switching circuits on/off plus their on/off time), as well as a voltage increment for analysis (e.g., algorithm mixed performance lever). Similarly, for each available alternate power source and global Vdd, the system requirements identify the allowable voltage range, the maximum average power, and the maximum be power.

Further, the system requirements identify the maximum number of unique voltage islands that should be contained in the chip and the maximum number of islands that can be powered on or off using a header switch. The system requirements also identify which chip-level available voltage supplies can be power on or off at off-chip sources.

The system requirements also include data for each logic module and chip input/output (I/O). Such data includes the chip area size; critical timing at each voltage within a set of allowable voltages for the technology and system; the switching waveforms between modes of functional operation and times of functional in activity; and the active and standby power requirements for each module or input/output for each period of inactivity. The system requirements identify state-saving latches 125 whose last date before inactivity must be present at resumption of activity, and a logic signal that uniquely identifies the period of inactivity. The system requirements define (for each functional logic module) a list of allowable voltages for each module at which time requirements are met (positive slack), and a definition of operating modes in which the module is internally inactive (does not change logic state).

Figure 3:
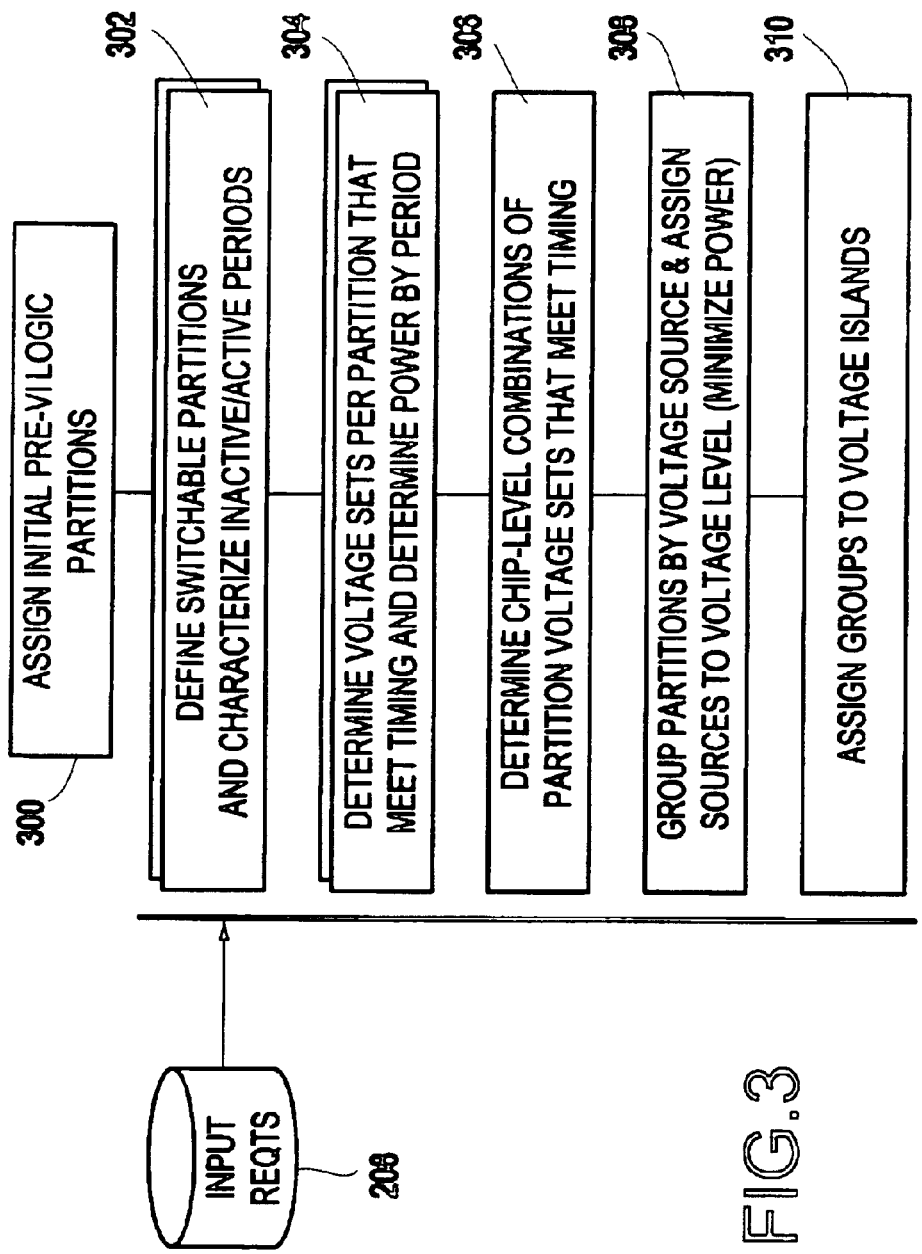
FIG. 3 is a schematic diagram illustrating the processing occurring in item 200 in FIG. 2.

Referring now to FIG. 3, the invention uses these inputs 208 in order to partition the chip into voltage islands. The partitioning processing begins with item 300 which takes the initial logic partitions that are assigned prior to any voltage island partitioning. Next in item 302, the invention defines switchable partitions and characterizes inactive and active periods. The processing related to item 302 is shown in greater detail in FIG. 4 and is discussed below. Next, in item 304, the invention identifies the voltage sets (per partition) that meet timing requirements and also determines the power requirements (by period). The detailed processing of item 304 is shown in greater detail in FIG. 5 and is discussed below. In item 306, the invention determines which chip-level combinations of partition voltage sets meet the timing requirements. The detailed processing occurring in item 306 is illustrated and discussed below with respect to FIG. 6. In item 308, the invention groups partitions by voltage source and assigns sources to the various voltage levels (in order to minimize power consumption). The details of item 308 are shown and discussed below with respect to FIG. 7. Finally, in item 310, in order to complete the partitioning, the invention assigns groups to the various voltage islands. The details of the processing in item 310 are shown in FIG. 8 and are discussed below.

Figure 4:
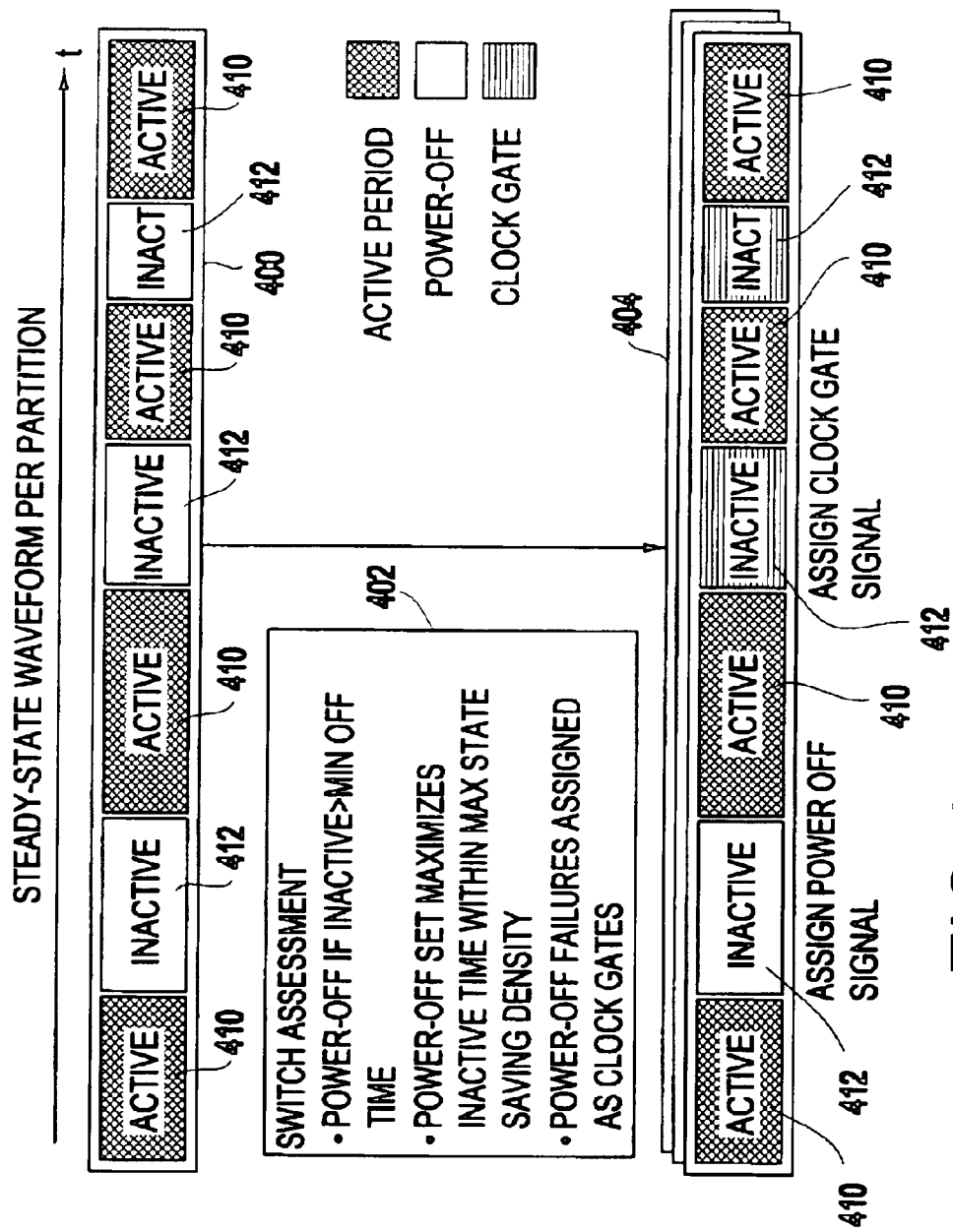
FIG. 4 is a schematic diagram of waveforms illustrating the processing occurring and item 302 in FIG. 3.
Figure 5:
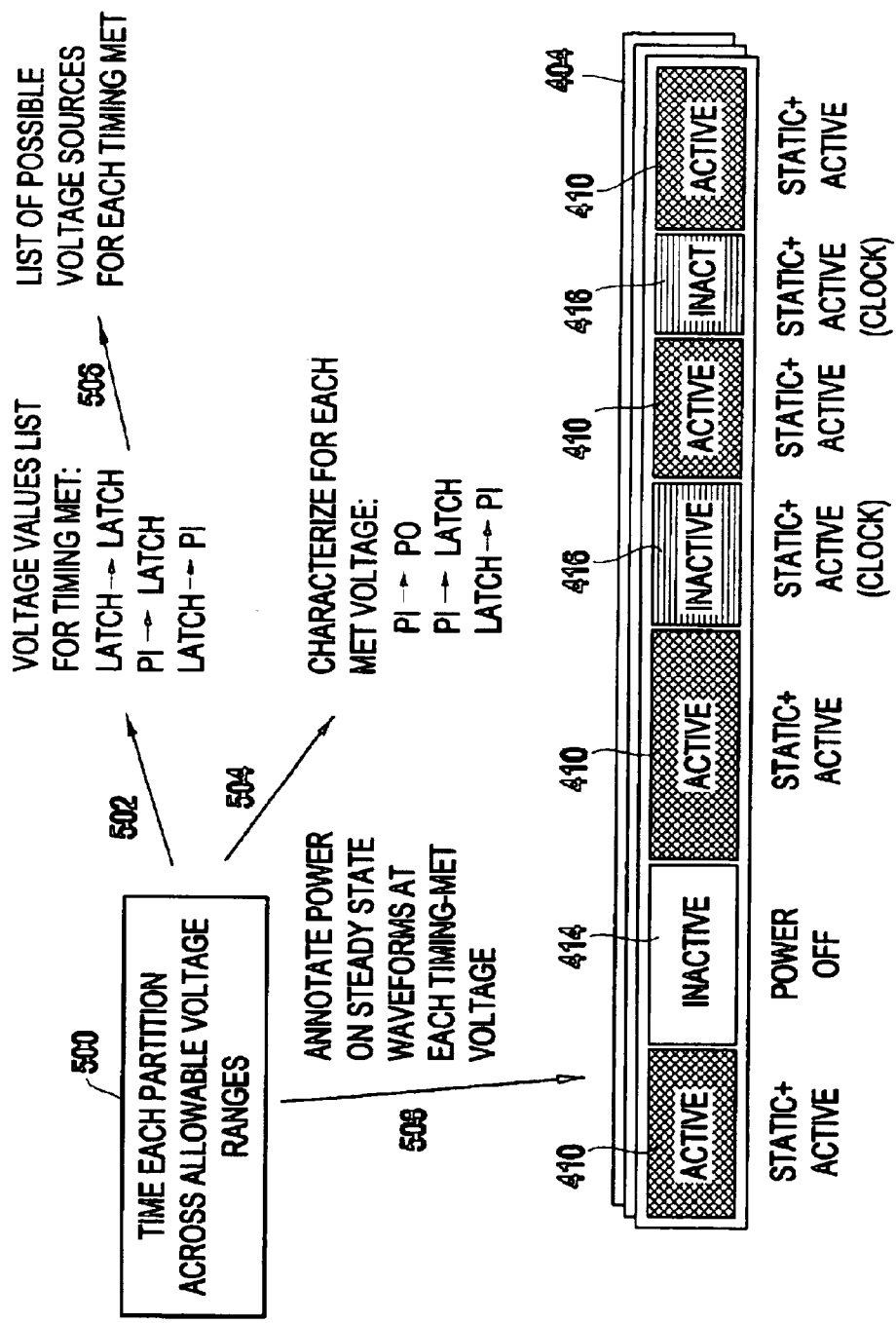
FIG. 5 is a schematic diagram of the waveform illustrating the processing occurring in item 304 in FIG. 3.

As mentioned above, FIG. 4 illustrates how the invention defines switchable partitions and characterizes inactive and active periods. Two waveforms 400, 404 are illustrated in FIG. 4. The upper waveform 400 represents the active 410 and inactive periods 412 for a given module. The processing shown in item 402 modifies the waveform to classify the inactive periods 412 as either power-off inactive periods 414 or clock-gated inactive periods 416.

More specifically, in item 402, the invention determines whether each inactive period 412 is less than a minimum inactive time. While one embodiment of the invention identifies one possible limit (average latches per unit area) and one possible method for maximizing the amount of inactive time that meets this limit, the invention is not limited to such methods and, instead, is intended to broadly include any method of identifying the set of inactive periods. The minimum inactive time is established by the designer and controls the granularity of the process.

If the inactive period is less than the minimum inactive time, clock gating is assigned to this inactive period.

Otherwise, for those inactive periods that exceed the minimum inactive time, a power off signal can be assigned. As discussed above, by utilizing a power off signal, the voltage leakage associated with clock gated inactive periods is avoided.

Further, the invention maximizes power savings by utilizing the power-off signal for as many inactive periods as possible. The invention does this by first classifying those inactive periods below the minimum inactive time as a candidate inactive periods. Then, the invention assembles a set of required state-saving latches for each candidate inactive period. From this, the invention creates a composite list of state saving latches across all candidate inactive periods.

Next, the invention determines whether there is a sufficient number of state saving latches available to convert the clock-gated inactive periods into power-off inactive periods. If so, the invention converts all such clock-gated inactive periods into power-off inactive periods. If there are insufficient state saving latches to convert all such clock-gated inactive periods, the invention assigns the state saving latches to the longest clock-gated inactive periods first. This allows only the shortest inactive periods to remain as clock-gated periods, while all longer inactive periods are converted to power-off inactive periods. In other words, the invention tries to convert all inactive periods 412 to power-off inactive periods 414. However, because of the limited number of state saving latches available, some inactive periods 412 (the shortest inactive periods) fail becoming power-off inactive periods and are assigned as clock gated inactive periods 416. Therefore, as shown in waveform 404, the invention revises the waveform 400 to include active periods 410, inactive periods that are clock gate controlled 416, and inactive periods that are power-off signal controlled 414.

As mentioned above, FIG. 5 illustrates the details of processing that occur in item 304 in FIG. 3. In item 500, the invention times each partition across allowable voltage ranges. The allowable voltage ranges are calculated from the system requirements. More specifically, the minimum and maximum voltage values incremented by the voltage increment established in the system requirements establish the voltage levels at which each partition will be timed. Global voltages are only assigned to the top-level partitions.

Arrow 502 indicates all voltage values that meet latch-to-latch path, latch-input/output path (PI), and input/output-latch path timing requirements. Voltages that do not meet these path timing requirements are not considered allowable voltage ranges. As indicated by arrow 506, this allows the invention to output a list of possible voltage sources that can supply the voltage within the allowable voltage ranges (as limited by the list of allowable voltage sources for each given module and the allowable voltage ranges of each source). Arrow 504 indicates that the invention extracts (characterizes) each path timing for each of the allowable voltage ranges. The invention is intended to include any method of characterizing a logic entity across a number of voltage operating points for the latter purpose of determining whether an interconnection of these modules and various combinations of the voltage points meets an overall chip performance goal.

As shown by arrow 508, the invention annotates the waveforms to include information regarding estimated standby power and estimated active power at each allowable voltage. For example, the estimated standby power is based upon the area when power is on; however, no standby power would be consumed when voltage is off. Similarly, active power would be zero or a minimum value during clock-gated inactive periods, and zero when the power was off. Active power is based on area and clock frequency when not clock-gated. In addition, if more detailed active power data is available (e.g., using a switching-based estimator from a simulation tool, etc.) this data is substitute for the above estimates.

Figure 6:
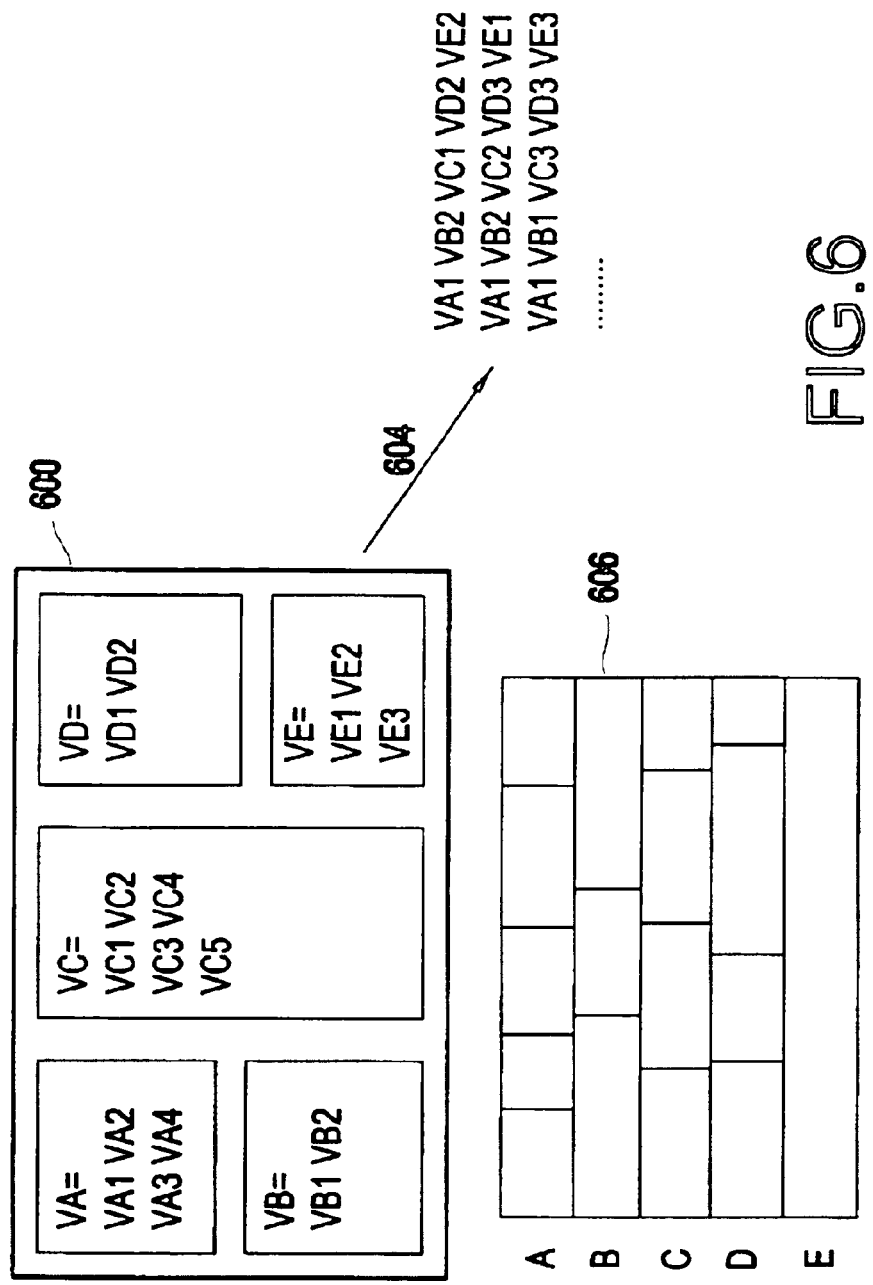
FIG. 6 is schematic diagram of voltage sets and illustrates the processing occurring in item 306 in FIG. 3.

As mentioned above, FIG. 6 illustrates the details of item 306 shown in FIG. 3. In FIG. 6, item 600 represents a list of all combinations of modules/top-level allowable voltages. In item 600, for example, logical partition D includes two timing-met partition voltage values VD1 and VD2. These combinations of allowable voltages are characterized by their path times. The invention runs a chip-level timing analysis on each element shown in item 600 based upon the characterizations of the logic modules and of the top-level logic. Any elements that fail such a chip-level timing analysis are removed from item 600. The remaining data base of timing-met partition voltage values is output as indicated by arrow 604. Item 606 illustrates the chip-level power waveforms at each chip-level voltage set for each logical partition (A–E).

Figure 7:
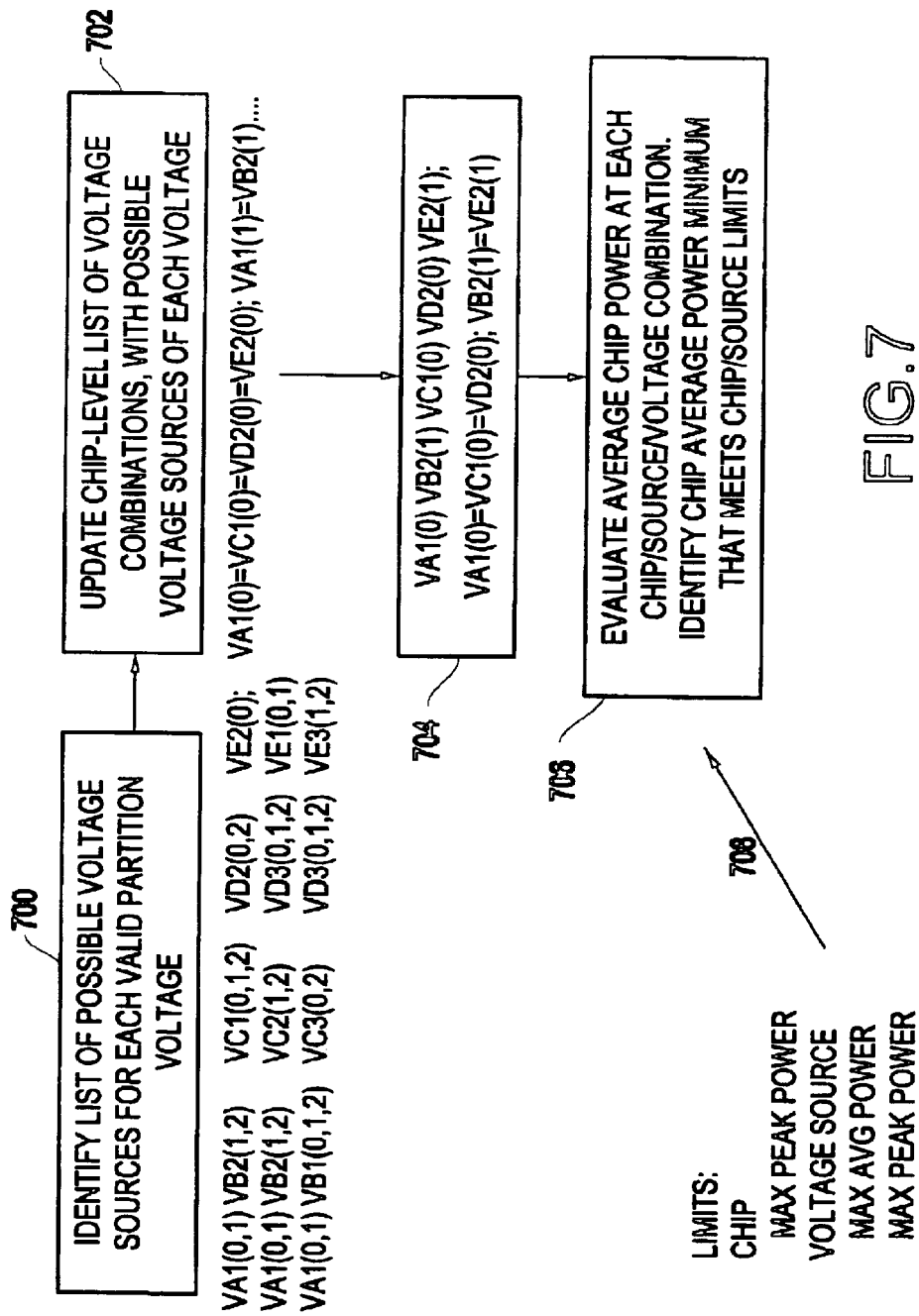
FIG. 7 is a schematic diagram of voltage combinations and illustrates the processing occurring in item 308 in FIG. 3.

FIG. 7 shows the processing occurring in item 308 in FIG. 3 in greater detail. More specifically, in item 700, for each valid partition voltage determined in step 306, the invention identifies a list of possible voltage sources. For example, the first valid partition voltage of logical partition A (VA1) includes two possible voltage sources (1 and 2) while the first valid partition voltage of partition B (VB1) includes three possible voltage sources (1–3). In item 702, the invention updates the chip-level list of voltage combinations with possible voltage sources of each voltage to produce the data base shown as item 704.

For each of the voltage combinations shown in item 704, the invention uses steady state waveforms for each module and top-level logic to calculate for the chip, for global Vdd, and for each alternative voltage source, the total average power across the waveform and the highest peak power across the waveform. The invention eliminates from the list of possible voltage islands any element that fail any of the chip or voltage source limits regarding the maximum power or maximum average power (as shown by arrow 708). Thus, as shown in item 706, the invention identifies which of the logical partition and voltage source combinations consume the lowest average power.

This allows the invention to minimize average power. This is achieved by finding the minimum chip peak power and for each power source and global Vdd, the minimum average active power consumed, the minimum average standby power is consumed, as well as the combined minimum average active and standby power, and minimum peak active and standby power.

As shown in item 310 in FIG. 3, the invention then assigns groups of logical partitions to specific voltage sources to define the voltage islands. This processing is shown in detail in FIG. 8. More specifically, in item 800 the invention starts with the list of logical partitions and lowest power consuming voltage sources and groups all modules with like voltage sources and similar power timing patterns into voltage islands. In the examples shown in item 800, VA1(0), VC1(0) and VD2(0) are grouped together because they all utilize voltage source (0) which runs at X volts. In a similar manner the matching waveforms in item 606 are used to group logical partitions by similar on/off power timing patterns.

Next, in item 802, the invention connects voltage sources as island power sources to corresponding partitions. In item

804, the invention assigns the above-determined lowest power consuming voltage to each voltage source for each given island. The invention then connects the clock gate and power off signals for each island as shown in item 806. Finally, the invention connects the global Vdd to the state saving latches in each island and connects all clock-gating signals to clock gating circuits and applies the same to corresponding clock nets, as shown in item 808.

As mentioned previously, item 202 in FIG. 2 illustrates that floorplanning occurs after the partitioning process 200 has been completed. FIG. 9 illustrates the floorplanning in greater detail. More specifically, in item 900, for each island, the invention determines the physical shape (e.g., using a standard placement tool, RTL-based floorplan estimator, etc.) of each of the voltage islands. After that, for each island, the invention determines and places the power structure (grind or ring), again using a standard floorplanning tool, as shown in item 902. Then, the islands are placed and oriented (again using a standard planning tool) as shown in item 904. The placement and orientation of the islands is optimized for wiring decongestion and timing. Finally, each of the islands is connected to their respective power sources, as shown in item 906.

After the floorplanning, the invention performs an assessment process which is described in item 204 in FIG. 2. FIG. 10 illustrates this assessment processing in greater detail. More specifically, in items 1000, 1006, 1010, and 1016, the invention measures chip standby power, chip active power, and voltage drop, and analyzes timing and wireability, respectively. After each of the forgoing assessment steps, in decision blocks 1002, 1008, 1012, 1018, the invention determines whether the established structure violates or meets the various requirements. If the chip standby power or chip active power requirements are not met, the partitions are updated (as shown in item 1004). If the measured voltage drop or the timing and wireability are not acceptable, the floorplan is updated as shown in item 1014.

After the forgoing processing, as shown in item 206 in FIG. 2, the invention writes the voltage island speclist to output the voltage island speclist 212. More specifically, the voltage island speclist 212 includes, for each partition (voltage island), the name and power source list and type (pad, fatwire, etc.) of each power net. In addition, the voltage levels (minimum, maximum, nominal) is also included in the voltage island speclist. The switching signal and type (off chip, header (and instance or instance list), etc.) are also included in the voltage island speclist. Further, the voltage island speclist includes the power on hours, the steady state on percentage, and other similar information.

As mentioned above, the invention divides each semiconductor chip into a hierarchy of individual functional blocks (voltage islands). These voltage islands of the SoC design can have power characteristics unique from the rest of the design and, with the invention, can be optimized accordingly.

There are numerous scenarios where the inventive voltage islands can provide design leverage. Often, the most performance-critical element of the design, such as a processor core, requires the highest voltage level supported by the technology in order to maximize performance. Other functions which coexist on the SoC, such as memories or control logic, may not require this level of voltage, thereby saving significant active power if they can be run at lower voltages. In addition, voltage flexibility allows pre-designed standard elements from other applications to be in a new SoC application. Further, some functions, such as embedded analog cores, require very specific voltages, and can be more easily accommodated in mixed voltage systems.

In another example, the invention facilitates power savings in applications more sensitive to standby power, such as battery power functions. Commonly, complex SoC designs consist of a number of diverse functions, only a few of which are active at any given time. Methods such as clock gating can be used to limit the active power from these idling functions, but the leakage (or standby) power remains, and can be significant in high performance technologies. With the invention, the power supplies for these functions are partitioned into islands, so that the function can be completely powered off, thus eliminating both active and standby components of power. With the invention, the management of the power is built into the architecture and logic design of the SoC, to handle power sequencing and communication issues.

The inventive voltage island techniques do not replace all other methods of power management, in fact voltage island concepts can complement and amplify the effectiveness of other techniques. For example, clock gating can provide as much as 20–30% power savings for high performance functions. Clock gating can continue to be used for shorter duration "nap states" within the voltage islands which can also be powered off for longer duration "sleep states."

In addition to pre-defining clock-gated and powered-off functional islands, transition between the above mentioned "nap" and "sleep" states can be managed dynamically, by power management built into the architecture and logic design of the SoC. For example, when an island is to be inactivated for an unknown period of time, it may enter a clock gating "nap" state which can be quickly restored to the active state when required, particularly important if island must operate with short but frequent bursts of activity. However, if the power management logic detects that the island has been inactive for a long continuous period of time, it may predict that inactivity will continue long enough to justify entry to a powered-off "sleep" mode, thus providing further power savings for islands which experience long but unpredictable inactive periods.

The use of multi-threshold libraries is becoming a common method for trading-off active and standby power for a function. Low threshold devices provide a performance advantage over higher threshold transistors, particularly at lower voltage. Using Low-Vt transistors can allow timing closure at a lower voltage level, which can be a great savings for overall active power. Low device thresholds also imply higher levels of leakage current, however, which can be detrimental to standby power sensitive applications. For this reason, logic libraries utilizing high threshold transistors can be used in logic paths without critical timing. The higher voltage required to make these circuits meet performance goals can be justified by the reduction in standby power. In an SoC with varied performance and power requirements, these device and library options can be intermixed to optimize the diverse functions. Voltage island architecture methods enhance the usefulness of such multi-threshold design techniques. An island can be created to run an active power sensitive block with low Vt's at a lower voltage than the rest of the design. In addition, using voltage islands, this leaky, low-Vt block can be shut off completely during sleep modes to eliminate standby power. Similarly, functions which are "always on" can be held at a higher voltage to accommodate less "leaky" high-Vt transistors, or be powered from a separate, back-up supply. This application can be extended to include any method of biasing the voltage of transistors within an island for performance at the expense of increased standby power (forward biasing) or decreasing standby power at the expense of reduced performance (back biasing).

Voltage islands can be used at different levels of the design hierarchy to amplify their effectiveness. A block which can be powered off could exist within a larger block which is running at a unique voltage, for example. Constructing a voltage island capability with a fine hierarchical granularity can enable a large variety of useful permutations.

Thus, as shown above, a common logical and physical hierarchy is defined for each voltage island during the voltage island design planning and is described in the voltage island SpecList file. Then, each voltage island is processed in application specific integrated circuit (ASIC) front-end and back-end chip design flows. The collection of implementation requirements for voltage islands (voltage island SpecList) is used to provide needed voltage island information to drive the automated voltage island ASIC chip design implementation flows.

Figure 11:
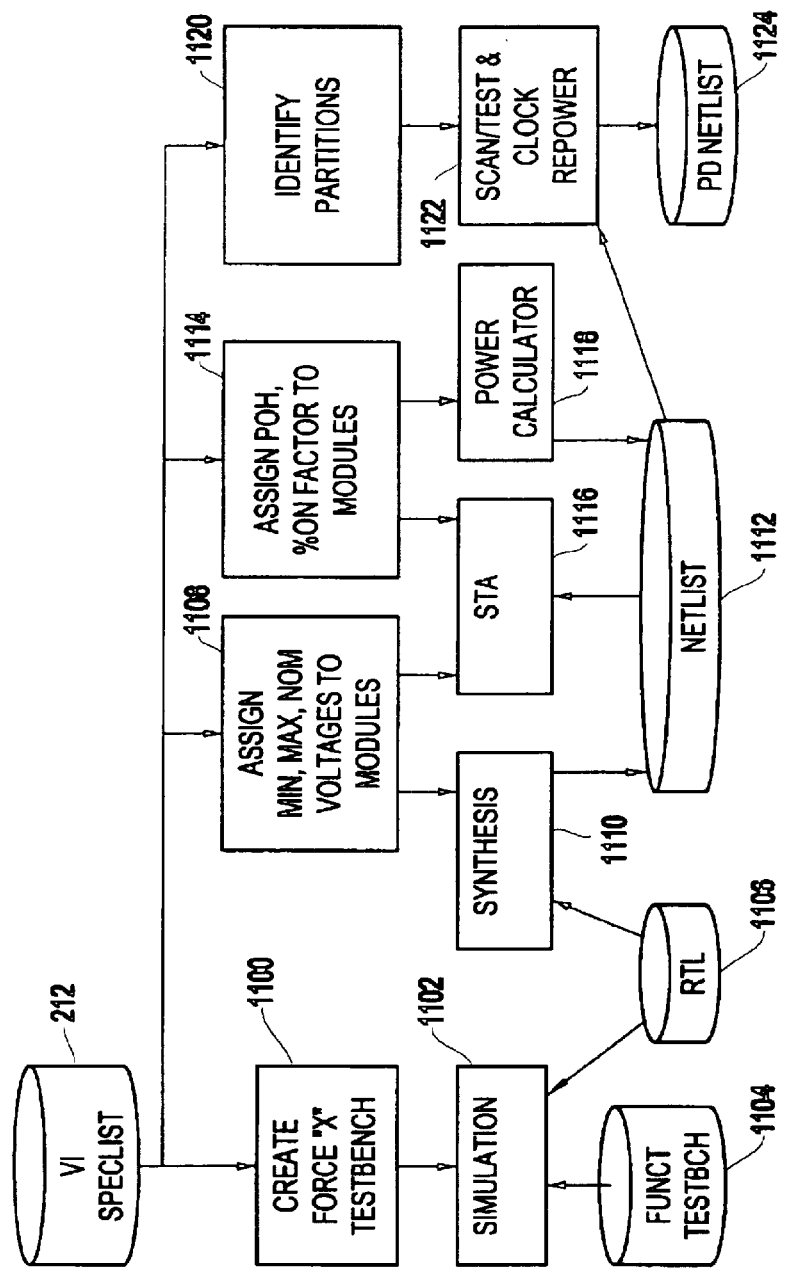
FIG. 11 is a schematic diagram of the front end voltage island design flow.

More specifically, shown in FIG. 11 is a "front end" flow of a chip implementation that automatically produces gate level connections. In other words, the processing flow shown in FIG. 11 is fully automated and does not require user intervention. The processing flow takes the information output in the voltage island specification list and automatically creates gate level connections.

In FIG. 11, item 212 is the voltage island speclist. From the voltage island speclist 212, the various minimum, maximum, and nominal voltages assigned to the modules are shown as item 1108. The power on hours and percentage on factors assigned to the modules in the voltage island specification list 212 are shown as item 114. Further, the partitions identified in the voltage island speclist 212 are shown as item 1120.

Item 1100 illustrates the feature of the invention that uses a test bench to effect an X-state (unknown state) on all of the island cell outputs when identified within the voltage island speclist 212 to indicate that a given voltage island will be in an "off" state. This allows the voltage island to be tested to determine whether X-state signals are being propagated to logic outside of the voltage island while the voltage island is in the "off" state (which would represent an error). When a voltage island is turned off, X-states are forced throughout the voltage island for all cells operating at the island's voltage level (global voltage (VDDG) powered cells are excluded from this action). Forcing these X-states helps to verify that all island outputs have been properly fenced. If state-saving latches (global voltage powered) are employed for island power-up state retention, forcing the X-states also verifies that state-saving latches usage is functionally correct with respect to the system design. The simulation mechanism that creates the forced X-states is a special testbench that runs within the simulation tool, in conjunction with the design netlist and the functional test bench. The functional test bench is shown as item 1104 and the register transfer level (RTL) description used in many automated design tools is shown as item 1106.

The synthesis engine is shown as item 1110 and uses the minimum, maximum, and nominal voltages assigned to the modules in the voltage island specification list 1108 in order to create the pre-physical design net list 1112. A static timing analysis 1116 is performed on the pre-physical netlist 1112, as is a power calculation 1118. Item 1122 represents the chip initialization, scanning, testing and clock RIE powering operations that are used to produce the physical design net list 1124.

Figure 12:
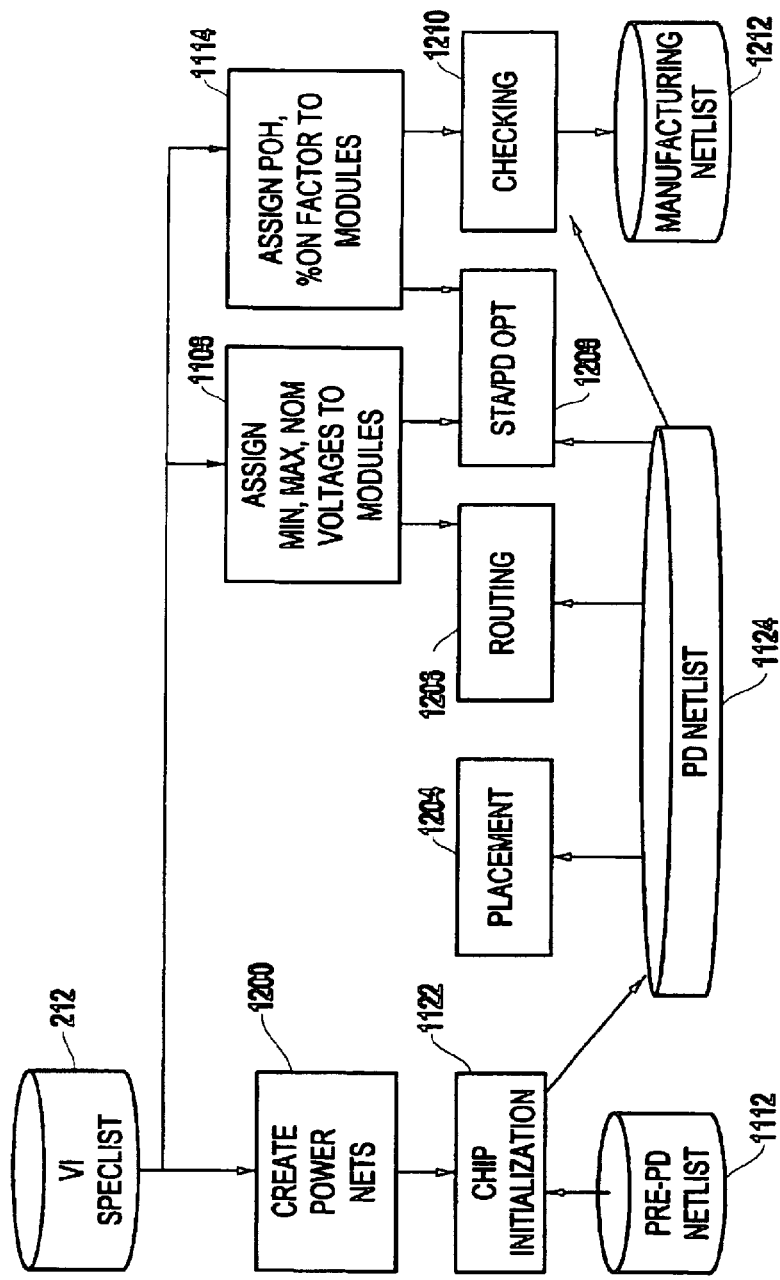
FIG. 12 is a schematic diagram of the back end voltage island design flow.

FIG. 12 illustrates the "back end" flow that automatically, and without user intervention, establishes power networks in order to produce a manufacturing netlist. More specifically, the creation of the power networks is shown as item 1200. The power networks are designed to be consistent with the requirements of the voltage island speclist 212. The pre-physical design netlist 1112 is utilized by the chip initialization engine 1122 in order to create the physical design net list 1124. Once the physical design netlist 1124 is created, placement 1204 and routing 1206 operations can be performed. Item 1208 represents the optimization of the static timing analysis and physical design, while item 1210 represents the checking which must be performed before the manufacturing netlist 1212 can be output.

Figure 13:
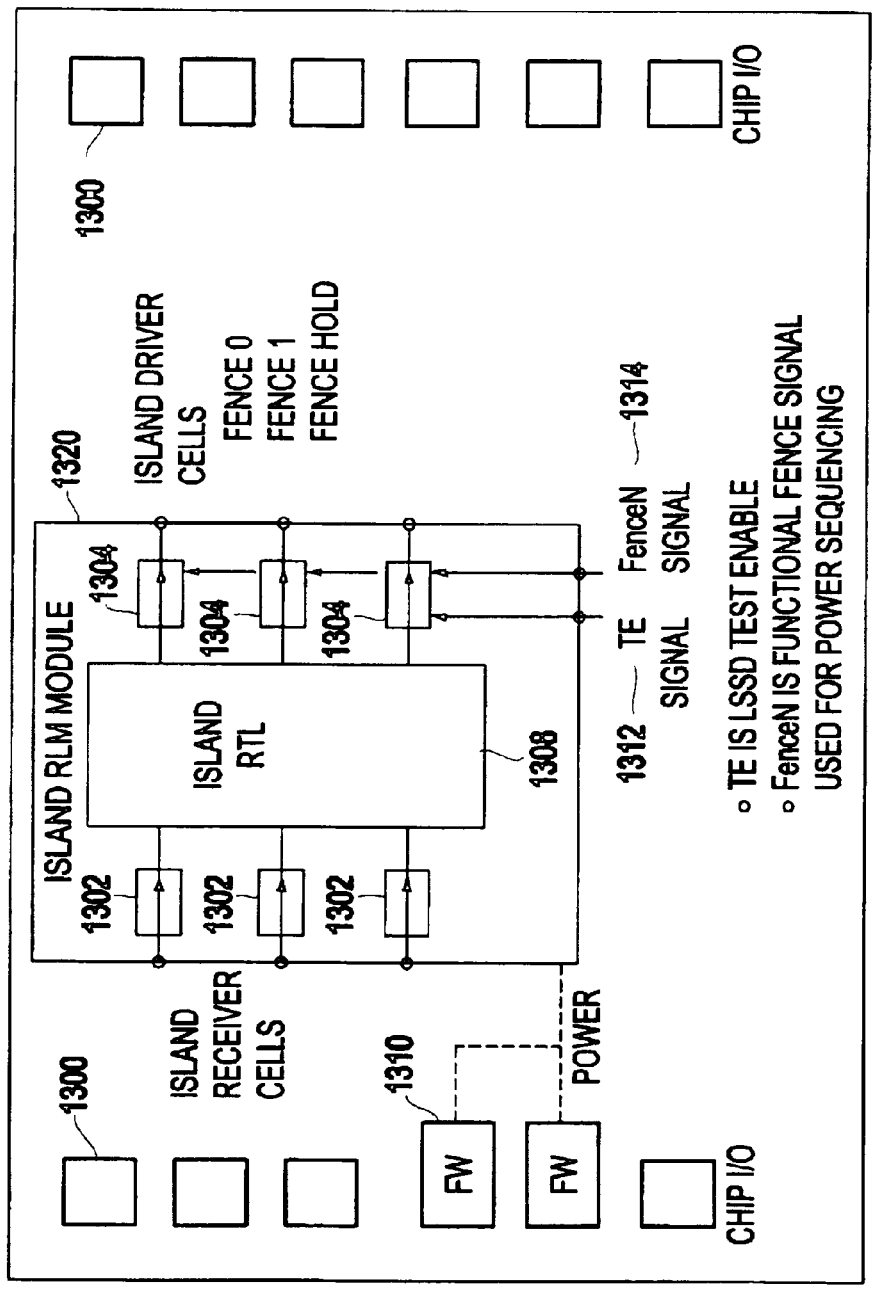
FIG. 13 is a schematic diagram illustrating a voltage island design using peripheral wire bonds.

FIG. 13 is a schematic diagram illustrating an island random logic macro (RLM) module 1320 that includes receiver cells 1302 and driver cells 1304 as well as voltage island represented in a register transfer level (RTL) description 1308. Items 1300 represent the chip input/output signal connections. Item 1310 represents a fatwire power supply. This type of power supply is useful with the peripheral wire bond implementation shown in FIG. 13. Item 1312 represents a test enable (TE) signal and item 1314 represents a fenceN control signal. The test enables signal comprises a level sensitive scan design (LSSD) type of test enable signal. The fenceN signal is a functional sleep mode control signal used for power sequencing. The island driver cells 1304 can include one of the following fencing modes, the fence 0 mode (which forces the drivers 1304 to output 0), a fence 1 mode (which forces the drivers 1304 to output 1), and a fense hold mode (which maintains the previous logical state of the island driver cells 1304).

During the design entry phase, logic designers enter voltage island receivers and drivers. The receivers and drivers are, for example, single-ended level shifters. The island input RLM receivers have a single input/output pair, while the islands output RLM drivers have the following fencing capabilities: fence output to 0, fense output to 1, and fence hold output. When the fenceN signal is 0, the output drivers are forced to their fenced value. Otherwise the drivers propagate their input-pin values to the voltage-island RLM outputs. The fenceN is an input and on all single-ended voltage island output drivers. The TE signal is an input pin on all "fence hold" driver types. The TE signal is a testability requirement for the fence-hold output drivers.

Figure 14:
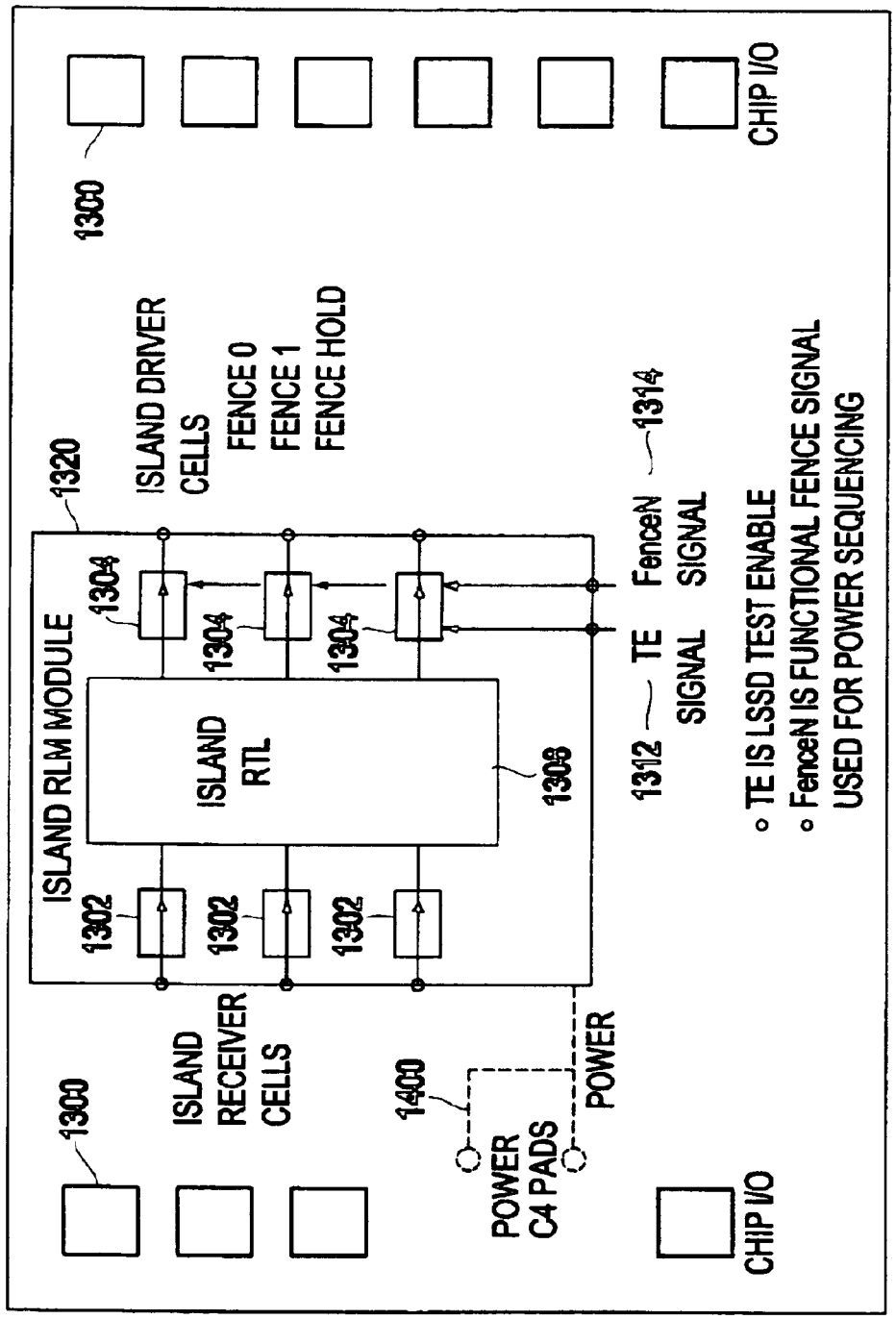
FIG. 14 is a schematic diagram illustrating a voltage island design using C4 pads.

The TE and fenceN input signals are not level-shifted inside the voltage island, so they do not require a single-ended receiver. Single-ended receivers and fencing circuits require power from the voltage island power sources and the chip (global) power source VDDG to perform voltage-level translation at each RLM port. Some voltage islands have a sparse global power source grid, in which case the single-ended receivers or fencing cells can reside anywhere in the RLM. In the absence of this grid, the cells should be placed near the global power source power ring on the periphery of the RLM. FIG. 14 is similar to the schematic shown in FIG. 13; however, the structure shown in FIG. 14 relates to C4 (copper pad) connections. More specifically, items 1400 illustrates the power C4 pad connections.

The invention includes a library of data communications circuits specifically designed to enable communications across voltage islands operating at different voltages. The sensing circuits handle voltage island communications when in the voltage island is powered down, and essentially establish a "known" state on the nets that connect other power islands the same circuits and also handle data communication when the voltage islands are powered up. Voltage island constraints are handled by the design system checking, simulation, synthesis, test insertion, physical-design optimization, placement, and power-routing tools.

Figure 15:
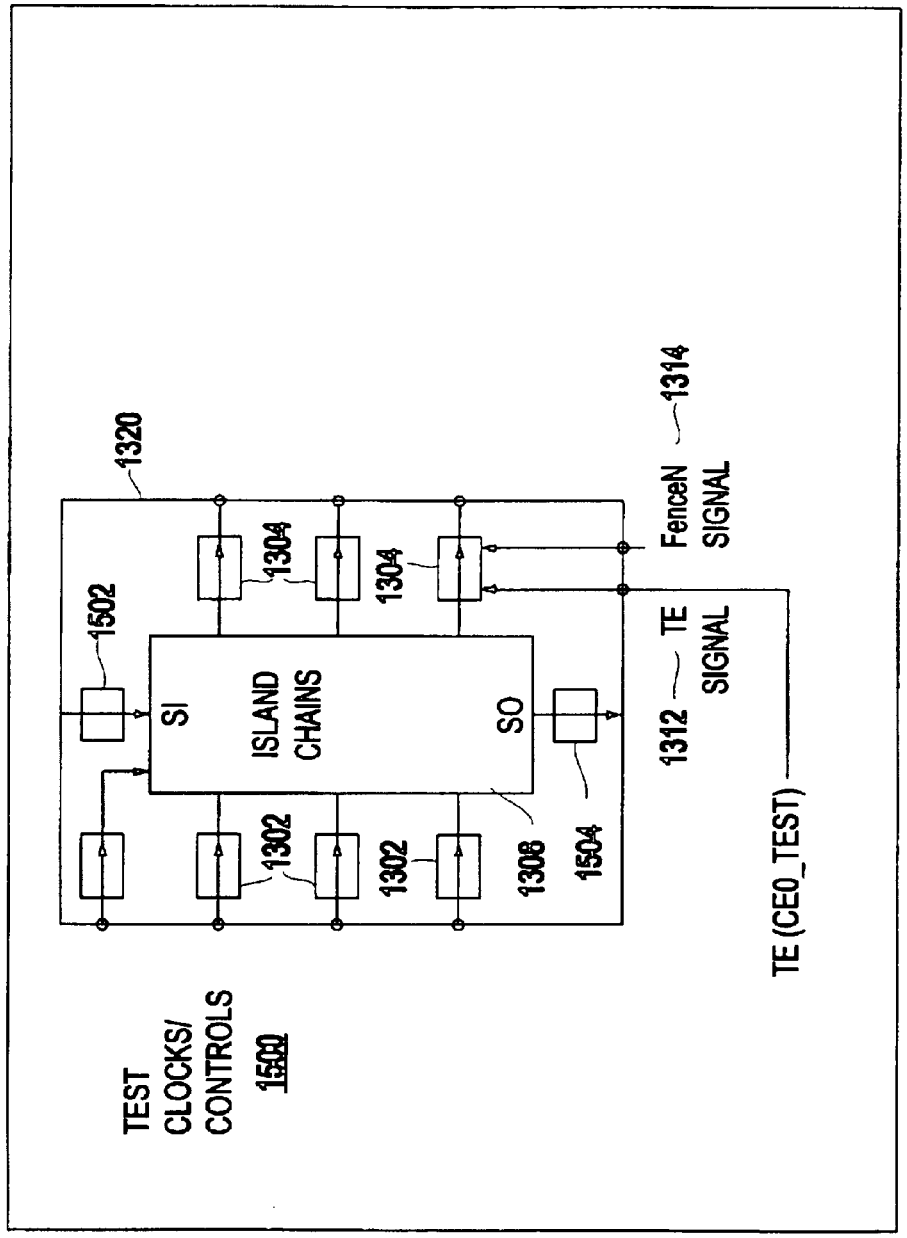
FIG. 15 is a schematic diagram illustrating a voltage island design for test synthesis.
Figure 16:
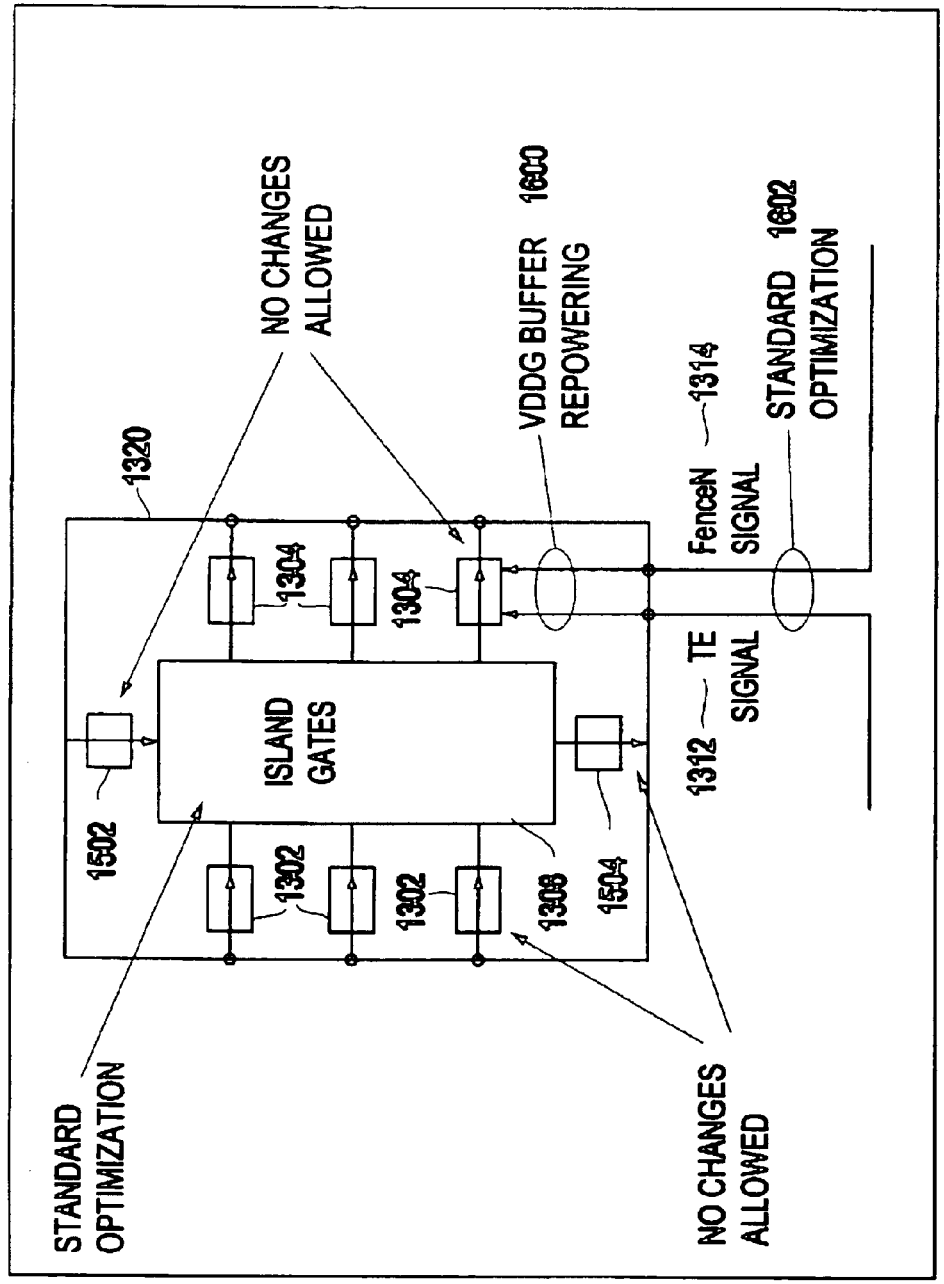
FIG. 16 is a schematic diagram illustrating a voltage island physical design optimization.

FIG. 15 illustrates the design for test synthesis (DFTS) which requires the addition of test clocks and controls 1500 as well as the scan in (SI) 1502 and scan out (SO)1504 receivers and drivers. Such structures enable consistent and easy testing of each voltage island individually, as well as testing all the voltage islands in combination. FIG. 16 represents the physical design (PD) optimization. During the optimization modifications to the voltage island are restricted. More specifically, changes within the voltage island are limited to minor power rebuffering 1600 and similar modifications. Outside the voltage island 1320, all standard optimization techniques 1602 can be applied without restriction. By restricting the changes that can be made within the voltage island, the invention helps maintain the initial structure required by the voltage island specification list 212, which will be substantially error free and provide the greatest power conservation.

While the invention has been described in terms of preferred embodiments, those skilled in the art will recognize that the invention can be practiced with modification within the spirit and scope of the appended claims.

What is claimed is:

1. A method of designing an integrated circuit chip, said method comprising:
   supplying a chip design;
   partitioning elements of said chip design according to similarities in voltage requirements and timing of power states of said elements to create voltage islands;
   outputting a voltage island specification list comprising at least one of power, simulation, reliability, floorplanning, and timing information of each voltage island; and
   simulating said chip design using an unknown voltage state propagation on voltage island cell outputs identified by a power-on/off control signal within said voltage island specification list.

2. The method in claim 1, further comprising performing a static timing analysis using minimum, maximum, and nominal voltages for each island from said voltage island specification list.

3. The method in claim 2, wherein said performing of said static timing analysis comprises, for paths communicating between two islands, using minimum-to-minimum, maximum-to-maximum, minimum-to-maximum, and maximum-to-minimum voltage values from said voltage island specification list to measure and optimize timing.

4. The method in claim 1, further comprising performing a power calculation utilizing power-on hours and a percent-on factor for each island from said voltage island specification list.

5. The method in claim 1, further comprising testing each island individually and said chip design as a whole.

6. The method in claim 1, wherein said simulating comprises using a test bench to force said voltage island cell outputs to said unknown states when said control signal indicates said power-off condition.

7. The method in claim 1, wherein said specification list comprises at least one of a power source name, a power source type, minimum voltage level, maximum voltage level, nominal voltage level, switching signal name, switching signal type, power on hours, and steady state on percentage.

8. A program storage device readable by machine, tangibly embodying a program of instructions executable by said machine for performing a method of designing an integrated circuit chip, said method comprising:
   supplying a chip design;
   partitioning elements of said chip design according to similarities in voltage requirements and timing of power states of said elements to create voltage islands;
   outputting a voltage island specification list comprising power and timing information of each voltage island; and
   simulating said chip design using an unknown voltage state on inputs of a voltage island when a timing waveform within said voltage island specification list indicates a power-off condition within said voltage island.

9. The program storage device in claim 8, wherein said method further comprises performing a static timing analysis using minimum, maximum, and nominal voltages for each island from said voltage island specification list.

10. The program storage device in claim 9, wherein said performing of said static timing analysis comprises, for paths communicating between two islands, using minimum-to-minimum, maximum-to-maximum, minimum-to-maximum, and maximum-to-minimum voltage values from said voltage island specification list to measure and optimize timing.

11. The program storage device in claim 8, further comprising performing a power calculation utilizing power-on hours and a percent-on factor for each island from said voltage island specification list.

12. The program storage device in claim 8, further comprising testing each island individually and said chip design as a whole.

13. The program storage device in claim 8, wherein said simulating comprises using a test bench to force said inputs to said unknown states when said control signal indicates said power-off condition.

14. The program storage device in claim 8, wherein said specification list comprises at least one of a power source name, a power source type, minimum voltage level, maximum voltage level, nominal voltage level, switching signal name, switching signal type, power on hours, and steady state on percentage.

* * * * *